(12) United States Patent
Jau et al.

(10) Patent No.: US 9,462,721 B2
(45) Date of Patent: Oct. 4, 2016

(54) SERVER

(71) Applicant: Quanta Computer Inc., Taoyuan Shien (TW)

(72) Inventors: Maw-Zan Jau, Taipei (TW); Chao-Jung Chen, New Taipei (TW); Chih-Ming Chen, Taoyuan County (TW); Wei-Cheng Tseng, New Taipei (TW)

(73) Assignee: Quanta Computer Inc., Tao Yuan Shien (TW)

( * ) Notice: Subject to any disclaimer, the term of this patent is extended or adjusted under 35 U.S.C. 154(b) by 203 days.

(21) Appl. No.: 14/228,323

(22) Filed: Mar. 28, 2014

(65) Prior Publication Data

US 2015/0092340 A1 Apr. 2, 2015

(30) Foreign Application Priority Data

Oct. 1, 2013 (TW) .............................. 102135533 A

(51) Int. Cl.
*H05K 7/14* (2006.01)
*G11B 33/12* (2006.01)
*G06F 1/18* (2006.01)

(52) U.S. Cl.
CPC ............ *H05K 7/1487* (2013.01); *G11B 33/128* (2013.01); *G06F 1/187* (2013.01); *H05K 7/1411* (2013.01)

(58) Field of Classification Search
CPC .. H05K 7/1487; H05K 7/1411; G11B 33/00; G11B 33/128; G11B 33/124; G11B 33/126; G11B 33/022; G06F 1/187

USPC ............ 361/679.31, 679.34, 679.37, 679.39, 361/727–730, 732, 740, 747; 312/223.1; 174/35 R

See application file for complete search history.

(56) References Cited

U.S. PATENT DOCUMENTS

| | | | |
|---|---|---|---|
| 8,054,620 B2 * | 11/2011 | Roesner et al. | 361/679.33 |
| 8,243,435 B2 * | 8/2012 | Li | 361/679.37 |
| 8,991,949 B2 * | 3/2015 | Kyle et al. | 312/302 |
| 2005/0257232 A1 * | 11/2005 | Hidaka | 720/654 |
| 2006/0171109 A1 * | 8/2006 | Chang | 361/685 |
| 2007/0230111 A1 * | 10/2007 | Starr et al. | 361/685 |
| 2010/0309621 A1 * | 12/2010 | Chang et al. | 361/679.39 |
| 2010/0321879 A1 * | 12/2010 | Peng et al. | 361/679.33 |
| 2011/0292589 A1 * | 12/2011 | Yang et al. | 361/679.32 |
| 2012/0218705 A1 * | 8/2012 | Huang | 361/679.37 |
| 2013/0342990 A1 * | 12/2013 | Jau et al. | 361/679.39 |
| 2014/0204537 A1 * | 7/2014 | Rust | 361/727 |
| 2014/0218845 A1 * | 8/2014 | Peng et al. | 361/679.01 |

* cited by examiner

*Primary Examiner* — Adrian S Wilson
*Assistant Examiner* — Abhishek Rathod
(74) *Attorney, Agent, or Firm* — Polsinelli PC

(57) ABSTRACT

A server includes a chassis, a main tray and a hard disk drive (HDD). The main tray is slidably connected to the chassis and is capable of pulling out of the chassis or pushing into the chassis along a first direction. The main tray includes an accommodating slot and a sub-tray. The sub-tray is slidably disposed inside the accommodating groove and when the main tray is pulled out of the chassis, the sub-tray can be slid along a second direction perpendicular to the first direction between an expanded position and a retracted position relative to the chassis. When the sub-tray at the expanded position, the hardware can be taken from the sub-tray or put on the sub-tray.

8 Claims, 7 Drawing Sheets

SERVER

RELATED APPLICATIONS

This application claims priority to Taiwan Application Serial Number 102135533, filed Oct. 1, 2013, which is herein incorporated by reference.

BACKGROUND

1. Field of Invention

The present invention relates to a server, and more particularly to a server with a hard disk drive that is hot-swappable.

2. Description of Related Art

In general, the so-called hot swapping or hot plugging means a function of directly physically connecting or plugging out a peripheral device to or from a computer system component without shutting down the computer system. The hot-swapping capability is a very important function on a server-level system for expanding system capabilities without interrupting computer services. Hot-swap devices of a common server may generally include a hot-swap power source, a hot-swap hard disk drive (HDD) and a hot-swap fan. Such hot-swap devices are usually disposed on a back plate of the server, so as to be replaced promptly from the back plate conveniently.

Typically, regarding a conventional hot-swap HDD, a HDD has to be first fastened on a HDD tray to form a modularize HDD tray, and then the modularize HDD tray can be slid in and fixed to slide rails of a host chassis. Currently, there are various ways of fastening the HDD on the HDD tray, and one of the most popular ways is to directly use a screw to fasten the HDD on the HDD tray.

However, the modularized hot-swap HDD itself occupies a relatively large space inside the server, and thus is not suitable for use in an application environment requiring a large amount of HDDs. More specifically, Electronic Industry Association (EIA) regulates that for one rack unit (1U), the height of a server host is 44.5 mm. Therefore, if the conventional HDD needs to be mounted with additional tray for placing in the server, the 1U rack server may accommodate fewer HDDs. Furthermore, since the conventional HDD needs to be additionally mounted with the HDD tray for being placed in the server, it takes a user more time to dismantle the HDD when the HDD needs replacing.

SUMMARY

Accordingly, one aspect of the present invention is to provide a server to resolve the aforementioned problem of the conventional skill.

According to an embodiment of the present invention, a server includes a chassis, a main tray and a hard disk drive is provided. The main tray is slidably connected to the chassis and can be pulled out of the chassis or pushed into the chassis along a first direction. The main tray includes an accommodating slot, a sub-tray and a tray door. A connection interface is disposed in the accommodating slot. A sub-tray is slidably disposed in the accommodating slot, and after the main tray is pulled out of the chassis, the sub-tray is operated to slide along a second direction perpendicular to the first direction so as to be placed between an expanded position or a retracted position relative to the main tray. The tray door includes a first end and a second end. The first end is pivotally connected to the sub-tray, and the second end is selectively fastened to the sub-tray. The hard disk drive is connected to the connection interface and is held in the sub-tray. When the second end of the tray door is detached from the sub-tray, the hard disk drive is plugged out of the connection interface with the sub-tray sliding along the second direction, and is removed from the sub-tray.

According to an embodiment of the present invention, the sub-tray includes a hook member disposed opposite to the second end of the tray door. The tray door includes an engagement mechanism including a fixed member, a compression spring and a sliding piece. The fixed member is fixed on the second end of the tray door. The compression spring is disposed on the fixed member and passes through the fixed member. The sliding piece has a first side face and a second side face opposite to each other. The first side face is connected to the compression spring, and the second side face has a position-limiting groove arranged for engaging with the hook member.

According to an embodiment of the present invention, the tray door has a first wall and a second wall adjacent to the first wall. The first wall is connected to the fixed member, and the second wall has a position-limiting hole placed at the second end of the tray door. A bump is disposed between the first side face and the second side face, and is limited in the position-limiting hole.

According to an embodiment of the present invention, a side surface of the tray door has a pivot hole. The tray door has a pivotal connection mechanism includes a torsion spring and a shaft. A helical structure is disposed on each of two end portions of the torsion spring, and an end of each end portion is inserted into the sub-tray. The shaft passes through the helical structure and is connected to the sub-tray.

According to an embodiment of the present invention, when the second end of the tray door is detached from the sub-tray, a torque force provided by the torsion spring enabled the tray door to rotate about an axis of the shaft.

According to an embodiment of the present invention, an end of the main tray has a transmission member which is connected to the chassis. The transmission member has at least one bent element and arm elements. The bent element is pivotally connected between two adjacent arm elements. When the main tray is pulled out of the chassis, the arm elements turn into a stretched state from a folded state.

According to an embodiment of the present invention, the main tray has a hand grip disposed on an end opposite to the end of the main tray having the transmission member. The hand grip is used to pull the main tray out of the chassis or to push the main tray into the chassis along the first direction.

According to an embodiment of the present invention, the main tray further includes a stationary board connected between two opposite ends of the main tray and partially covering the accommodating slot.

According to an embodiment of the present invention, when the sub-tray slides to the expanded position relative to the main tray, the sub-tray is exposed out of the stationary board. When the sub-tray slides to the retracted position relative to the main tray, the stationary board partially covers the sub-tray.

According to an embodiment of the present invention, a sliding rail assembly is disposed in the chassis, in which the sliding rail assembly includes a sliding groove and a sliding member. The sliding groove is fixedly in the chassis along the first direction. The sliding member is operated to slide into the sliding groove and is connected to the main tray.

According to one or more embodiments of the present invention, the server has been configured with a main tray and a sub-tray for holding a hard disk drive. As a result, the hard disk drive does not have to be collocated with an additional tray for being assembled as the server like conventional server which has to use a modularize HDD tray, and thus the server of the aforementioned embodiments may allow more hard disk drives to be installed therein than the conventional server either the same size of rack unit.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
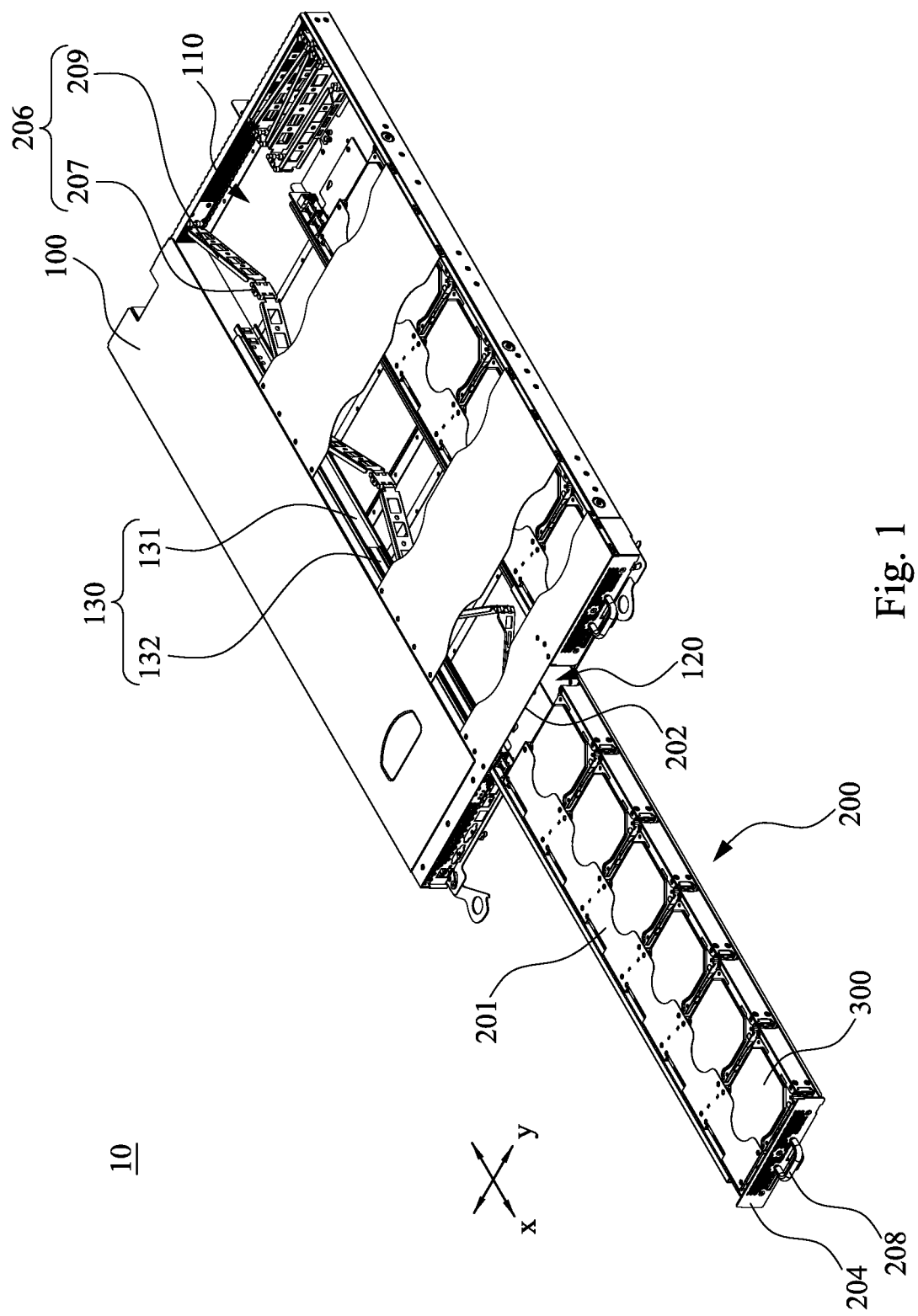
FIG. 1 illustrates a main tray being pulled out of a server according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

In the following embodiments, a server configured with trays is provided. In these embodiments, a user merely needs to place a hard disk drive on one of the trays in the server and to push the tray back into the server, and the hard disk drive can be electrically connected to the server. Therefore, the server of the embodiments may greatly reduce assembling or replacing time of a hard disk drive. Further, in the following embodiments, the hard disk drive does not need an additional tray to turn into a modularized disk tray for being hot-swappable in the server, such that under the same size, the server of the embodiments may allow more hard disk drives to be installed therein than a conventional server. Examples regarding how a server may allow more hard disk drives to be installed therein are shown in the following figures.

FIG. 1 illustrates a main tray being pulled out of a server according to an embodiment of the present invention. In FIG. 1, a server 10 includes a chassis 100, a main tray 200 and a hard disk drive 300, in which the main tray 200 is slidably connected to the chassis 100 and can be pulled out of the chassis 100 or be pushed into the chassis 100 along a first direction X.

Specifically, the chassis 100 of the server 10 has at least one accommodating channel 110, and an outer side of chassis 100 has an opening 120, in which the accommodating channel 110 links to the opening 120. The main tray 200 may slide in the accommodating channel 110 and be pulled out of the chassis 100 from the opening 120. The main tray 200 of the present embodiment carries several hard disk drives 300. For example, one single main tray 200 in FIG. 1 carries 6 hard disk drives, but is not limited thereto. In other embodiments, the number of the hard disk drives 300 carried by the main tray 200 may be different according to different sizes of the hard disk drives 300 and the server 10.

A sliding rail assembly 130 includes a sliding groove 131 and a sliding member 132. The sliding groove 131 and the sliding member 132 are disposed in the accommodating channel 110 along the first direction X and extend to the opening 120. More particular, the sliding groove 131 may be fixed in the chassis 100, such as being mounted on an inner wall of the chassis 100. The sliding member 132 is connected to the main tray 200 and may slide in the sliding groove 131.

Furthermore, the main tray 200 has a first end-face 202 and a second end-face 204. A transmission member 206 is connected to the first end-face 202 and the chassis 100, so as to establish a connection of electricity signal or power between the chassis 100 and the main tray 200. Specifically, the transmission member 206 may have transmission wires for communicating between the servers 300 held in the main tray 200 with a control unit or a processing unit in the chassis 100.

The second end-face 204 of the main tray 200 may have a hand grip 208. When the main tray 200 is retracted back into the accommodating channel 110 of the chassis 100, the hand grip 208 protrudes from the opening 120. As a result, a user may pull the main tray 200 from the chassis 100 along the first direction X by the hang grip 208, or push the main tray 200 into the chassis 100 along the first direction X by the hand grip 208 again.

The transmission member 206 which is connected to the first end-face 202 of the main tray 202 has bent elements 207 and arm elements 209. Each of the bent elements 207 is pivotally connected between two adjacent arm elements 209. A transmission line set of the transmission member 206 may be disposed along the bent elements 207 and the arm elements 209. Since each of the bent elements 207 is pivotally connected between the two adjacent arm elements 209, the two adjacent arm elements 209 can be switched between a stretched state and a folded state. As illustrated in FIG. 1, when the main tray 200 is pulled out of the chassis 100, the two adjacent arm elements 209 which are connected through one of the bent elements 207 may turn into the stretched state from the folded state.

Through the configuration of the bent elements 207 and the arm elements 209, when the main tray 200 is pulled out of the chassis 100, the transmission line set of the transmission member 206 is still electrically connected to the hard disk drive 300 of the main tray 200. It is important to maintain the electrical connection between the hard disk drive 300 and the chassis 100, such that, if a user replaces one hard disk drive 300, the other hard disk drives 300 on the main tray 200 may still function normally.

In the following embodiments, essential components of the main tray 200 is introduced firstly and the way of taking out the hard disk drive 300 is introduced secondly with reference to FIGS. 2-4 which illustrate different stages during the hard disk drive being taken out of the main tray.

Figure 3:
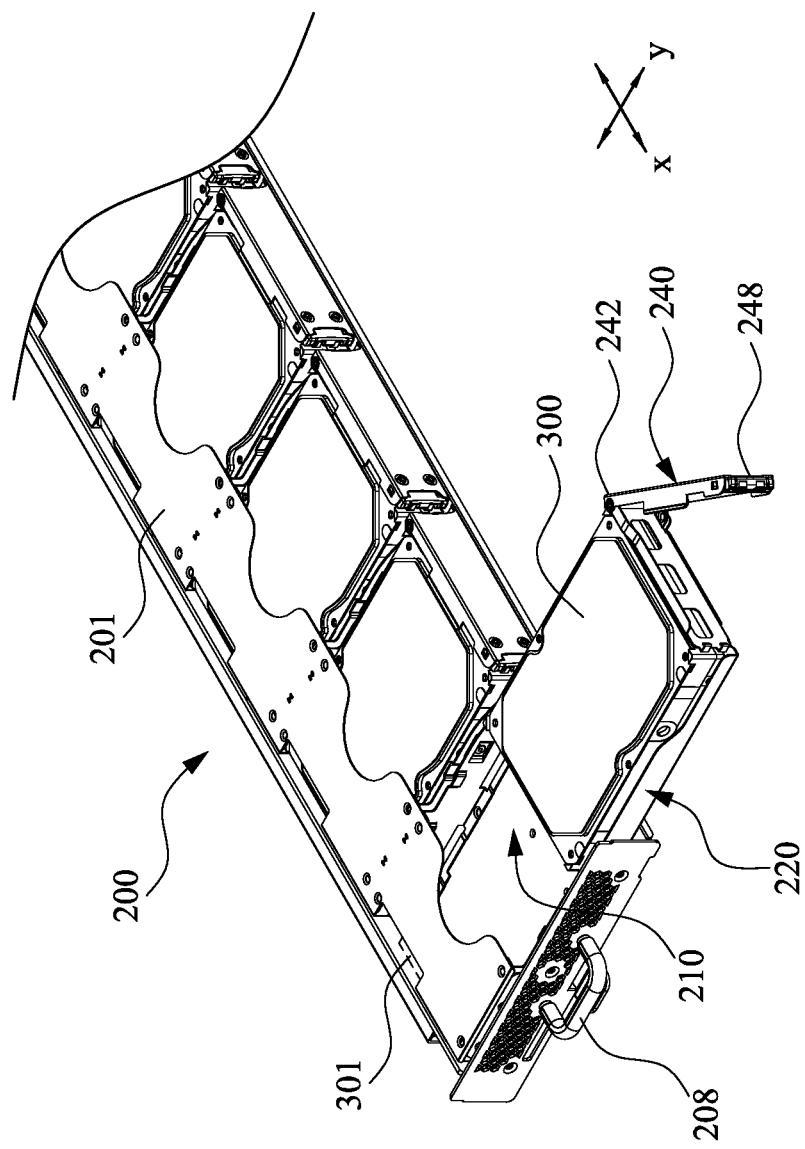
Figure 4:
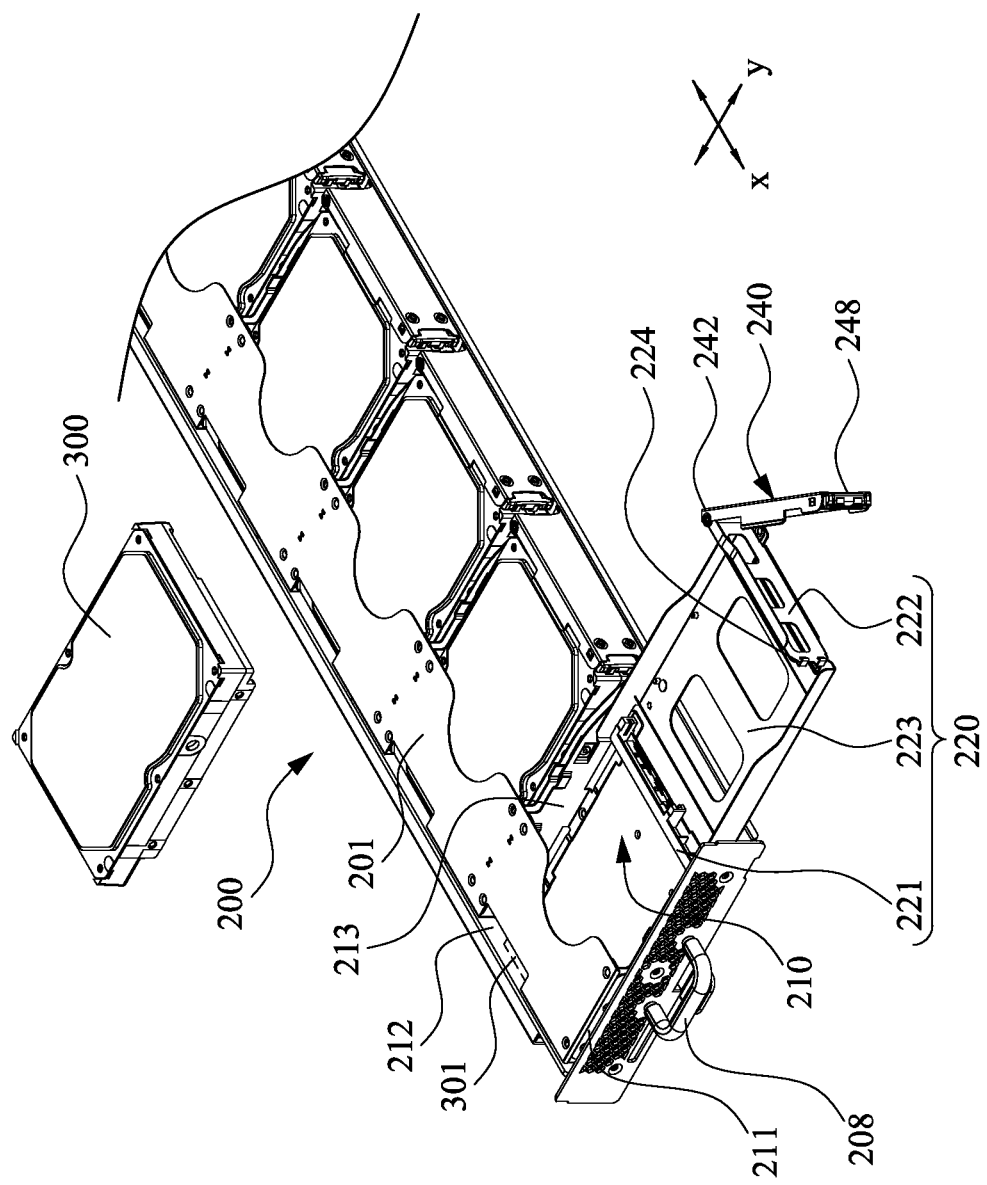

The main tray 200 has accommodating slots 210 and sub-trays 220 (as illustrated in FIGS. 3-4). These accommodating slots 210 are used to hold the hard disk drives 300. Each accommodating slot 210 may be, for example, a rectangular groove surrounded by three side walls 211, 212 and 213 and a rear wall 221 of the sub-tray 220, but is not limited thereto. The side wall 212 is connected between the side walls 211 and 213 and is opposite to the rear wall 221. A height of the rear wall 221 is smaller than a height of the side walls 211, 212 and 213, and may only be one half of the height of the side walls 211, 212 and 213.

The hard disk drive 300 is held by the sub-tray 220, and may have a connector near a top of the rear wall 221. A connection interface 301 is disposed in the accommodating slot 201. Specifically, the connection interface 301 may be disposed on the side wall 212, and may be used for connecting to the connector of the hard disk drive 300, such that when the sub-tray 200 is slid into the accommodating slot 210 along with the hard disk drive 300, and the connector of the hard disk drive 300 may be inserted into the connection interface 301 of the side wall 212.

The accommodating slot 210 may have the structures of sliding elements, such that the sub-tray 220 may slide into the accommodating slot 210, but is not limited thereto. The sub-tray 220 of the present embodiment may be movably disposed in the accommodating a lot 210. After the main tray 200 is pulled out of the chassis 100 along the first direction X, the sub-tray 220 can slide along a second direction Y perpendicular to the first direction X, and is placed between an expanded position or a retracted position relative to the main tray 200. For example, FIG. 2 shows the retracted position of the sub-tray 220 relative to the main tray 200 and FIG. 3 shows the expanded position of the sub-tray 220 relative to the main tray 200.

The sub-tray 220 may include a board portion 223, a rear wall 221 and a front wall 222 opposite to the rear wall 221. The board portion 223 may have a rectangular shape, such that the sub-tray 220 may be slidably disposed in the rectangular accommodation groove 210. The rear wall 221 stands on an edge of the board portion 223, and the accommodation groove 210 is surrounded by the rear wall 221 and the side walls 211, 212 and 213. The front wall 222 disposed opposite to the rear wall 221 may also be disposed on an edge of the board portion 223.

The main tray 220 further includes a tray door 240. The tray door 240 of the present embodiment may have a rectangular shape. The tray door 240 may have a first end 242 and a second end 248, in which the first end 242 is pivotally connected to the sub-tray 220, and the second end 248 is selectively fastened to the sub-tray 220. A hook member 224 is disposed on the front wall 222 of the sub-tray 220, and is opposite to the second end 248 of the tray door 240, such that the tray door 240 may be engaged with the hook member 224 of the sub-tray 220.

Figure 2:
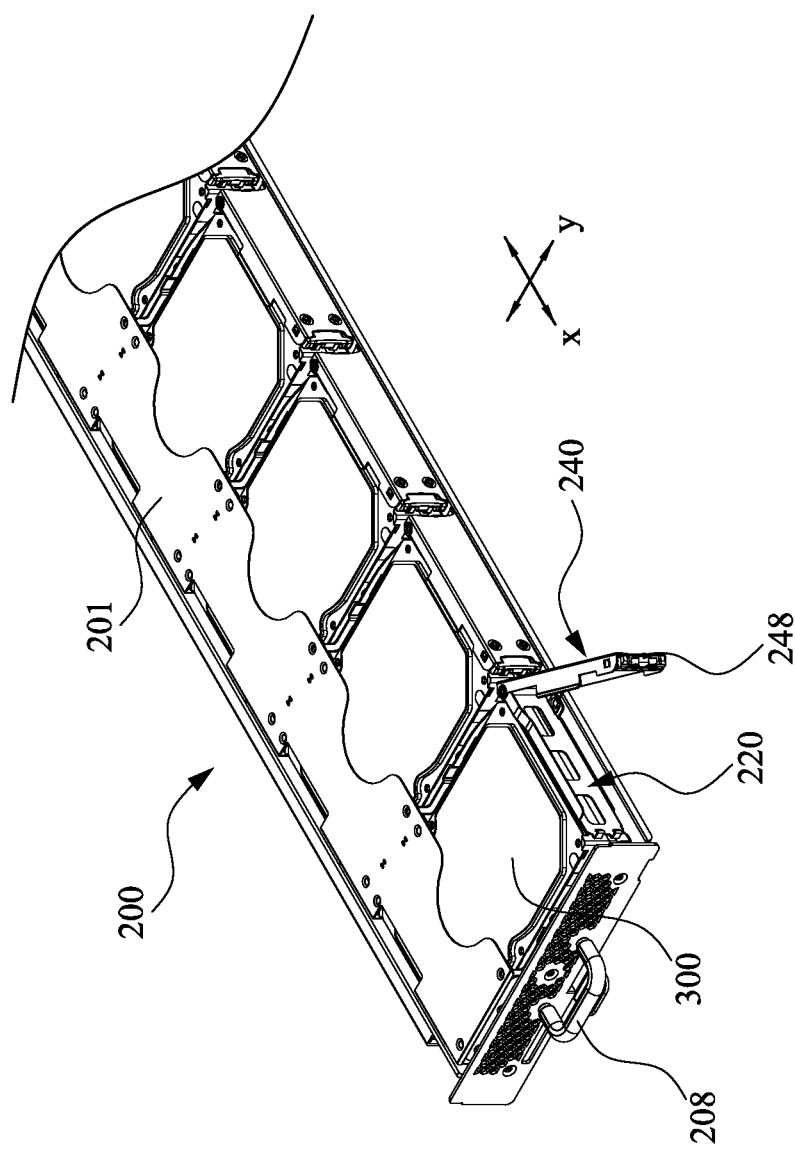
FIGS. 2-4 illustrate different stages during the hard disk drive being taken out of the main tray.

As illustrated in FIG. 2, after the main tray 220 is pulled out of the chassis 100 by a user, the second end 248 of the tray door 240 may be detached from the sub-tray 220. The way of how the second end 248 is detached from the sub-tray 220 is described in the following embodiment.

As illustrated in FIG. 3, a user may pull the tray door 240 along the second direction Y. At the same time, the hard disk drive 300 may be plugged out of the connection interface 301 with the sub-tray 220 sliding along the second direction Y. As illustrated in FIG. 4, when the sub-tray 220 is placed at the expanded position, the hard disk drive 300 may be directly removed from the sub-tray 220.

It is should be noted that, the main tray 200 of the present embodiment may include a stationary board 201 shown in FIG. 1. The stationary board 201 is connected between two ends of the main tray 200. After the main tray 200 is pushed into the chassis 100, the stationary board 201 can be used to fix the position of the hard disk drive 300, such that when the server 10 is moving, the hard disk drive 300 will not be damaged due to vibration caused by the moving of the server 10.

In the present embodiment, the stationary board 201 partially covers the accommodating slot 210. As a result, the sub-tray 220 may need to slide to the expanded position relative to the main tray 200 so as to be exposed out of the stationary board 201, and then the hard disk drive 300 can be taken out of sub-tray 220. When the sub-tray 220 slides to the retracted position relative to the main tray 200, the stationary board 201 partially covers the sub-tray 220.

From the configuration disclosed in the aforementioned embodiments, the hard disk drive 300 may be hot-swapped in the server in a form of bare disk. Specifically, the conventional hard disk drive 300 needs to be mounted with an additional tray by using screws or any other types of fastening elements, and the hard disk drive 300 of the present embodiment does not need screws but merely needs to be put onto the sub-tray 220 of the chassis 100, thereby reducing the replacing or assembling time of the hard disk drive 300. Further, since the server 10 of the present embodiment already has be configured with the maim tray 200 and the sub-tray 220, the hard disk drive 300 does not need an additional tray, and thus the internal space of the server 10 can accommodate more hot-swap hard disk drives 300 than the conventional server under the same size of rack unit.

Figure 5:
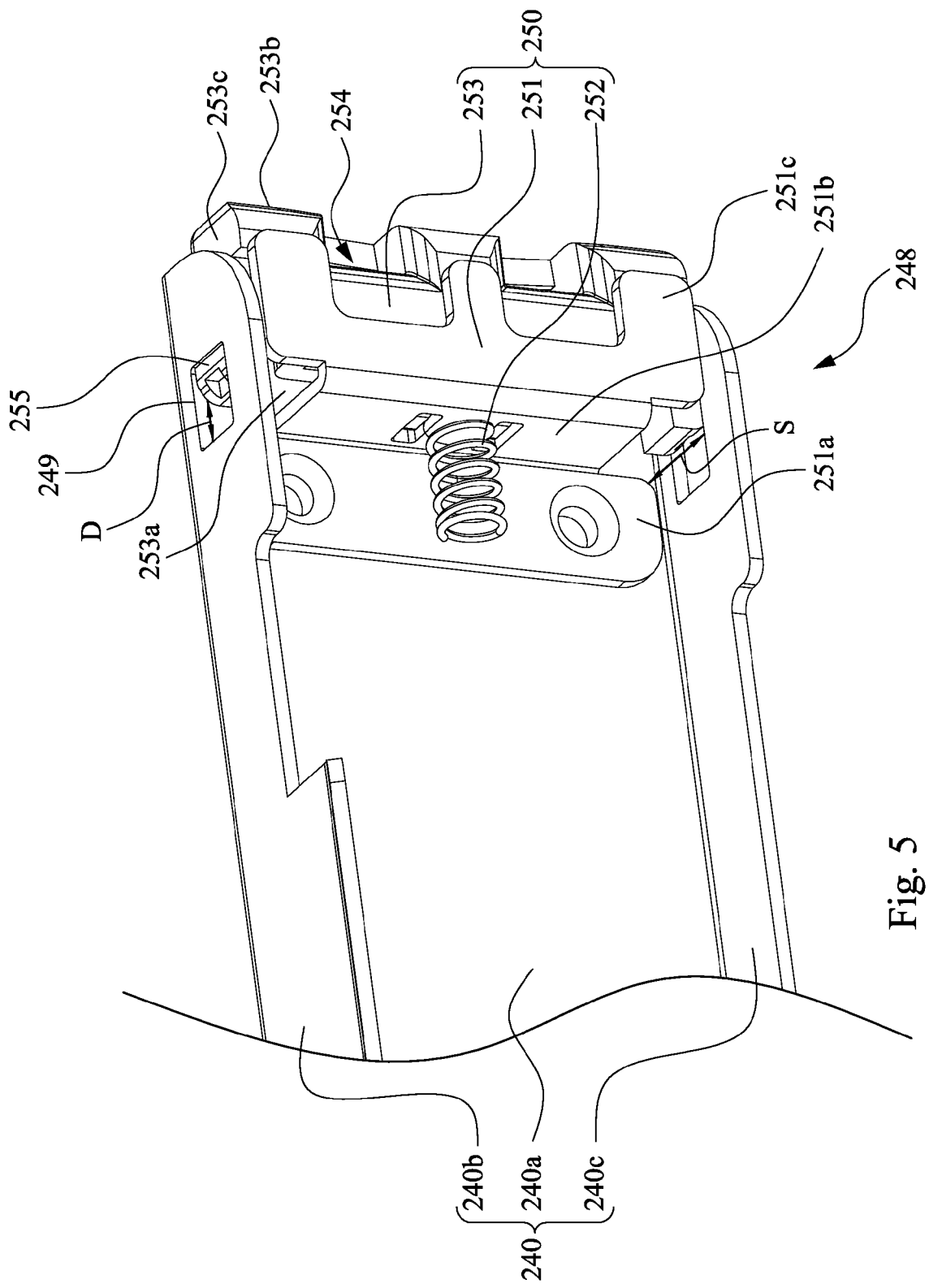
FIG. 5 illustrates an enlarged view of a engagement mechanism of a tray door in FIG. 4.
Figure 6:
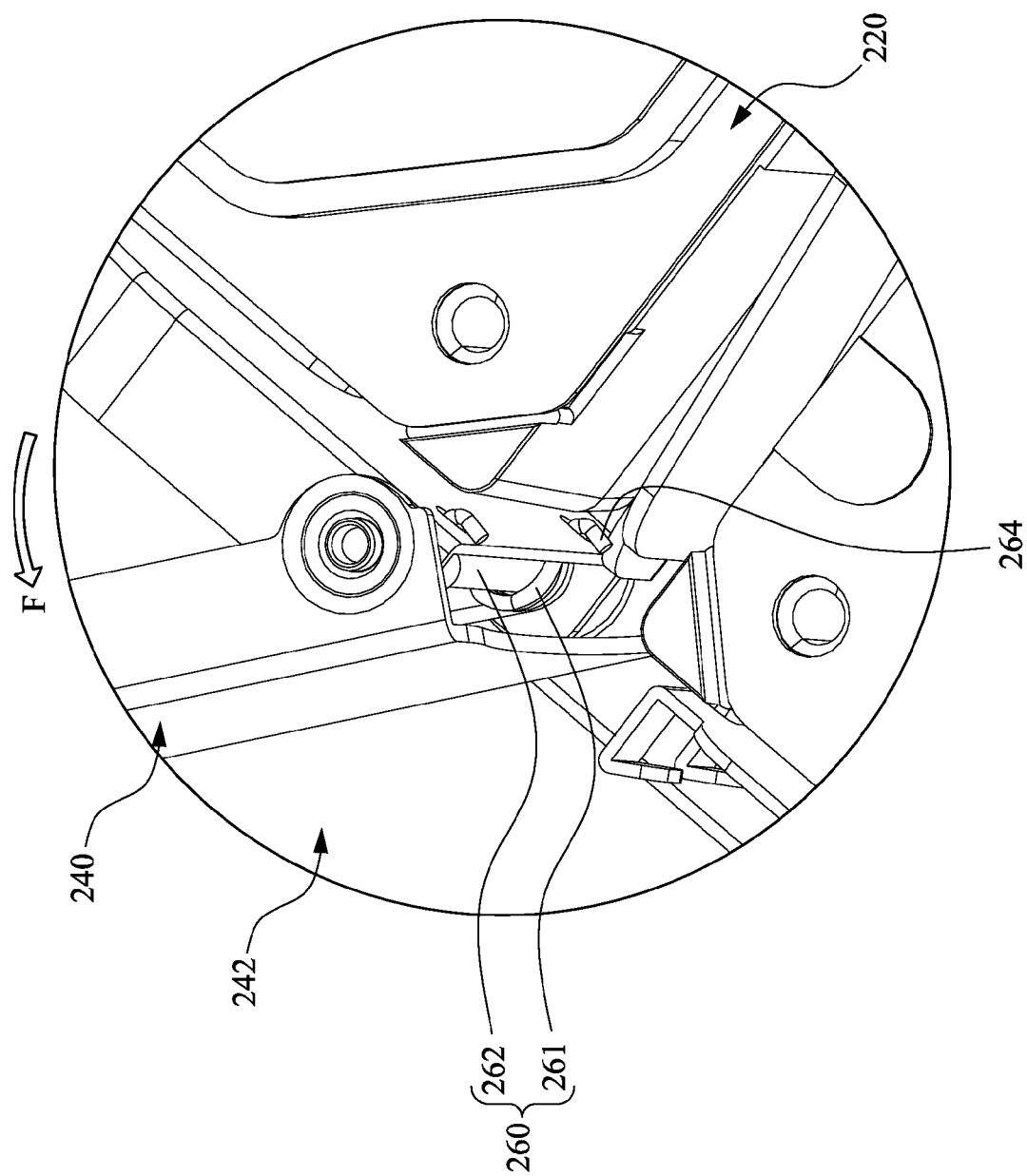
FIG. 6 illustrates an enlarged view of a pivotal connection mechanism of the tray door in FIG. 4.
Figure 7:
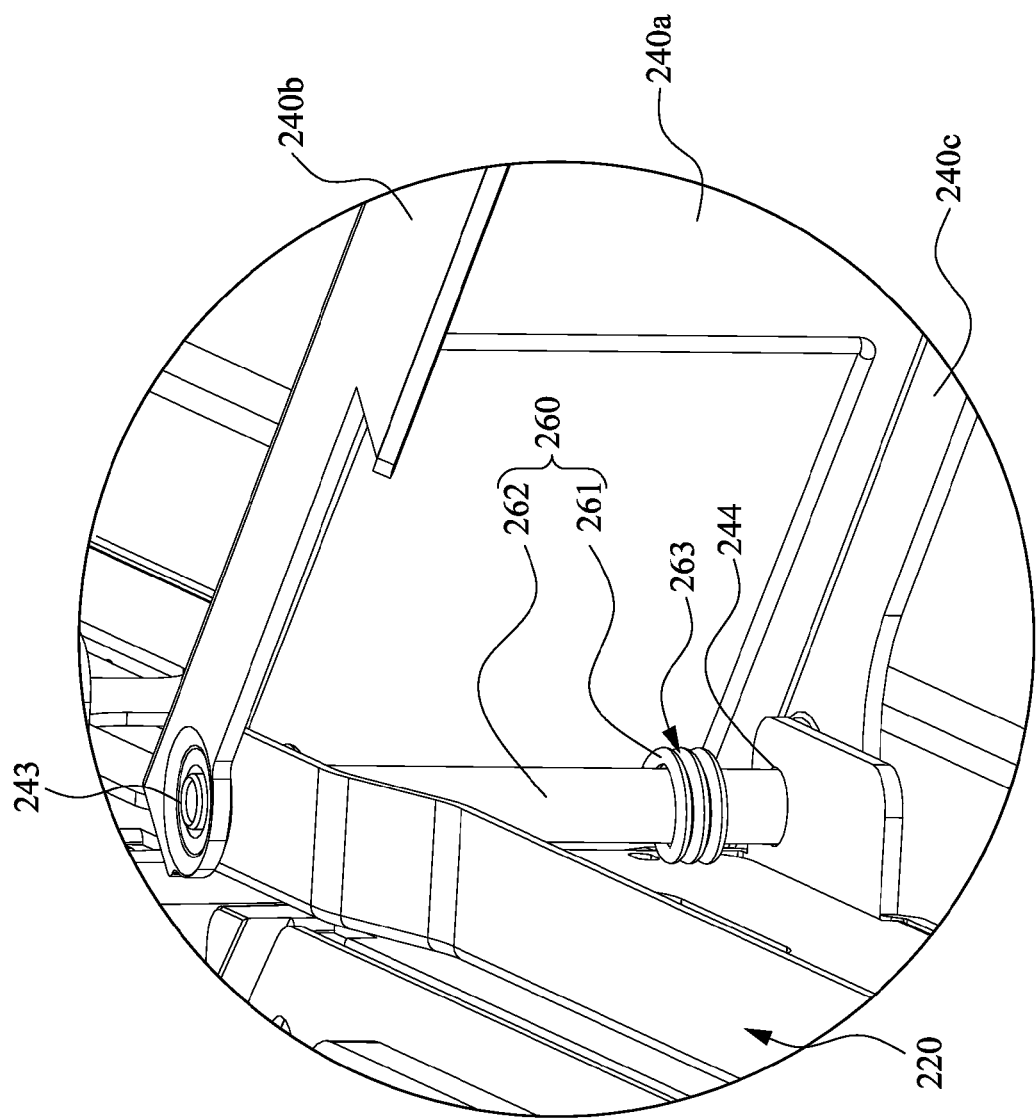
FIG. 7 illustrates another enlarged view of the pivotal connection mechanism in FIG. 4.

In the following embodiment, a pivotal connection mechanism of the first end 242 of the tray door 240 and a fastening mechanism of the second end 248 of the tray door 240 are shown in FIGS. 5-7. FIG. 5 illustrates an enlarged view of an engagement mechanism 250 of the tray door 240 in FIG. 4, and FIGS. 6-7 illustrate two different enlarged views of a pivotal connection mechanism 260 of the tray door 240 in FIG. 4.

As illustrated in FIG. 5, the engagement mechanism 250 is located on the second end 248 of the tray door 240. The engagement mechanism 250 includes a fixed member 251, a compression spring 252 and a sliding piece 253. The tray door 240 has a first wall 240a, a second wall 240b and a third wall 240c, in which the first wall 240a is opposite to the sub-tray 220 and has two fastening holes near the second end 248, and the second wall 240b and the third wall 240c are disposed adjacent to the first wall 240a and perpendicular to the first wall 240a respectively and can be the side walls of the tray door 240.

The fixed member 251 may have a board shape with consecutive bends. For example, the fixed member 251 may include a first plate 251a, a second plate 251b and a third plate 251c, in which the first plate 251a and the second plate 251b are formed as an L-shape, and the second plate 251a and the third plate 251c are formed as an L-shape as well. The first plate 251a and the third plate 251c are located on two opposite sides of the second plate 251b and are connected to two opposite sides of the second plate 251b respectively.

The first plate 251a of the fixed member 251 has two fastening holes facing the two fastening holes of the first wall 240a, such that the fixed member 251 may be fastened with the first wall 240a through the fastening holes of the first plate 251a and the first wall 240a. The second plate 251b has two rectangular openings at the middle portion, and the compression spring 252 is disposed on the fixed member 251 and partially passes through the fixed member 251 and two rectangular openings. The third plate 251c is disposed parallel to the first wall 240a of the tray door 240, and is spaced from the first wall 240a by a distance S.

The sliding piece 253 is disposed within the distance S and is connected to the compression spring 252. More specifically, the sliding piece 253 may be a rectangular piece which has several side faces. For example, a first side face 253a near the second plate 251b is connected to an end of the compression spring 252 and the first side face 253a is spaced from the second plate 251b by a distance D. A second side face 253b opposite to the first side face 253a has a position-limiting groove 254. Such position-limiting groove 254 is arranged for engaging with the hook member 224.

A bump 255 is disposed on a third side face 253c between the first side face 253a and the second side face 253b. More specifically, the third side face 253c faces the second wall 240b of the tray door 240, and the bump 255 protrudes from the third side face 253c. The second wall 240b has a position-limiting hole 249 near the second end 248, and the bump 255 is limited in the position-limiting hole 249.

The compression spring 252 can pushing the sliding piece 253 along a direction from the first end 242 to the second end 248, so as to make the bump 255 abut against an edge of the position-limiting hole 249. When the second end 248 of the tray door 240 is detached from the sub-tray 220, the sliding piece 253 is pushed toward the first end 242, thereby detaching the tray door 240 from the sub-tray 220.

For example, after the main tray 200 is pulled out of the chassis 100, a user has to open up the tray door 240 for taking out the hard disk drive 300. As illustrated from FIG. 1 to FIG. 2, the user may push the sliding piece 253 toward the first end 242 of the tray door 240 (See FIG. 3), thereby causing the first side face 253a of the sliding piece 253 to move toward the second plate 251b and moving distance D at most. Therefore, the hook member 224 is detached from the position-limiting groove 254 and becomes the state shown in FIG. 2.

As illustrated in FIG. 6 and FIG. 7, the tray door 240 has a pivotal connection mechanism 260 at the first end 242, and two pivot holes 243 and 244 are disposed near the first end 242 of first wall 240b and the second wall 240c of the tray door 240. Furthermore, the pivotal connection mechanism 260 includes a torsion spring 261 and a shaft 262, in which a helical structure 263 is set on each of two end portions of the torsion spring 261, and the shaft 262 is disposed and passes through the helical structure 263 to connect with the sub-tray 220, such that the tray door 240 may rotate about an axis of the shaft 262.

Furthermore, an end 264 of each of the two end portions of the torsion spring 261 may be inserted into the sub-tray 220, such that when the second end 248 of the tray door 240 is detached from the sub-tray 220, a torque force F provided by the torsion spring 261 enables the tray door 240 to rotate about an axis of the shaft 262 counterclockwise automatically, as shown in FIG. 6. For example, in FIG. 6, the tray door 240 rotates counterclockwise until an angle between the tray door 240 and the sub-tray 220 is about 45 degrees. Therefore, in the present embodiment, a user may push the sliding piece 253 of the engagement mechanism 250 to enable the tray door 240 to rotate counterclockwise automatically, such that the user may pull out the second tray 220 to the expanded position conveniently and quickly.

In sum up of the embodiments described above, through the use of the main tray and the sub-tray configured in the server, the hard disk drive is placed on the sub-tray firstly, and after the sub-tray is retracted into the main tray, the main tray can be pushed back into the chassis, so as to assemble a hard disk drive into the server quickly without using a screw or other fastening elements. Similarly, when one hard disk drive needs to be replaced, through the hand grip of the main tray, the main tray can be pulled out of the chassis directly, and then through pushing the sliding piece of the tray door of the sub-tray, the sub-tray can be pulled to the expanded position and meanwhile the hard disk drive and the connection interface of the main tray are disconnected, so as to take the hard disk drive out of the sub-tray quickly and directly. Furthermore, in the embodiments, the hard disk drive does not need to be mounted with additional trays. As a result, the server of the embodiments can allow more hard disk drives to be installed therein than a conventional server under the same size of rack unit.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A server, comprising:
a chassis;
a main tray slidably connected to the chassis, in which of the main tray is operated to be pulled out or pushed into the chassis along a first direction, the main tray comprising:
an accommodating slot having a connection interface;
a sub-tray slidably disposed in the accommodating slot, wherein, after the main tray is pulled out of the chassis, the sub-tray is operated to slide relative to the main tray along a second direction perpendicular to the first direction so as to be placed between an expanded position or a retracted position;
a tray door spanning a width of the sub-tray between a first end and a second end opposite to the first end, wherein the first end of the tray door is pivotally connected to the sub-tray, and the second end of the tray door is selectively engaged with the sub-tray; and
a hard disk drive which is suitable for being connected to the connection interface and held in the sub-tray;
wherein, when the second end of the tray door is detached from the sub-tray, the hard disk drive is plugged out of the connection interface with the sub-tray sliding along the second direction, and is removed from the sub-tray;
wherein the sub-tray comprises a hook member disposed opposite to the second end of the tray door;
wherein the tray door further comprises an engagement mechanism including:
a fixed member fixed on the second end;
a compression spring passing through the fixed member; and
a sliding piece having a first side face and a second side face opposite to each other, the first side face being connected to the compression spring, the second side face having a position-limiting groove arranged for engaging with the hook member; and
wherein the tray door has a first wall and a second wall adjacent to the first wall, and the first wall is connected to the fixed member, the second wall has a position-limiting hole, and the position-limiting hole is placed at the second end, and a bump is disposed between the first side face and the second side face and is limited in the position-limiting hole.

2. The server of claim 1, wherein a side surface of the tray door has a pivot hole, and the tray door has a pivotal connection mechanism including: a torsion spring having two end portions each of which has a helical structure, ends of the two end portions being inserted into the sub-tray; and a shaft which passes through the helical structure and is connected to the sub-tray.

3. The server of claim 2, wherein, when the second end is detached from the sub-tray, a torque force provided by the torsion spring enables the tray door to rotate about an axis of the shaft.

4. The server of claim 1, wherein an end of the main tray has a transmission member connected to the chassis, and the transmission member has at least one bent element and a plurality of arm elements, the bent element is pivotally connected between two adjacent arm elements, and when the main tray is pulled out of the chassis, the arm elements turn into a stretched state from a folded state.

5. The server of claim 4, wherein the main tray has a hand grip disposed on an end opposite to the end of the main tray having the transmission member, and the hand grip is used to pull the main tray out of the chassis or to push the main tray into the chassis along the first direction.

6. The server of claim 1, wherein the main tray further comprises a stationary board connected between two opposite ends of the main tray and partially covering the accommodating slot.

7. The server of claim 6, wherein, when the sub-tray slides to the expanded position relative to the main tray, the sub-tray is exposed out of the stationary board, and when the sub-tray slides to the retracted position relative to the main tray, the stationary board partially covers the sub-tray.

8. The server of claim 1, wherein a sliding rail assembly is disposed in the chassis, and the sliding rail assembly comprises:
- a sliding groove fixed in the chassis along the first direction; and
- a sliding member operated to slide into the sliding groove and connected to the main tray.

* * * * *